(12) United States Patent
Schmidt

(10) Patent No.: US 12,341,165 B2
(45) Date of Patent: Jun. 24, 2025

(54) METHOD FOR MONITORING A BATTERY SYSTEM

(71) Applicant: Mercedes-Benz Group AG, Stuttgart (DE)

(72) Inventor: Jan Philipp Schmidt, Creussen (DE)

(73) Assignee: Mercedes-Benz Group AG, Stuttgart (DE)

( * ) Notice: Subject to any disclaimer, the term of this patent is extended or adjusted under 35 U.S.C. 154(b) by 38 days.

(21) Appl. No.: 18/549,076

(22) PCT Filed: Mar. 2, 2022

(86) PCT No.: PCT/EP2022/055220
§ 371 (c)(1),
(2) Date: Sep. 5, 2023

(87) PCT Pub. No.: WO2022/189221
PCT Pub. Date: Sep. 15, 2022

(65) Prior Publication Data
US 2024/0113343 A1    Apr. 4, 2024

(30) Foreign Application Priority Data
Mar. 8, 2021 (DE) .................. 10 2021 001 217.8

(51) Int. Cl.
*H01M 10/42* (2006.01)
*G01R 31/3835* (2019.01)
*G01R 31/396* (2019.01)

(52) U.S. Cl.
CPC ...... *H01M 10/425* (2013.01); *G01R 31/3835* (2019.01); *G01R 31/396* (2019.01); *H01M 2010/4271* (2013.01)

(58) Field of Classification Search
CPC ............ H01M 10/42; H01M 10/425; H01M 10/4257; H01M 2010/4271; G01R 31/36;
(Continued)

(56) References Cited

U.S. PATENT DOCUMENTS 9,843,914 B1 * 12/2017 Rao .................. H04W 4/90
12,009,856 B2 * 6/2024 Fukaya .............. H04B 10/0795
(Continued)

FOREIGN PATENT DOCUMENTS

| CN | 111463873 A | 7/2020 | |
| DE | 10 2004 033 836 B3 | 9/2005 | |
| DE | 102019215812 A1 * | 11/2019 | .......... H01M 10/425 |

OTHER PUBLICATIONS

PCT/EP2022/055220, International Search Report dated Nov. 25, 2022 (Two (2) pages).
(Continued)

*Primary Examiner* — Franklin D Balseca
(74) *Attorney, Agent, or Firm* — Crowell & Moring LLP

(57) ABSTRACT

A method for monitoring a battery system having a battery module that has a plurality of battery cells. A battery management system is not active in a sleep mode of the battery system. The method includes monitoring a measured value in the sleep mode by a sensor arrangement and comparing the measured value with default values by the sensor arrangement. A wake-up signal is triggered when the measured value deviates from the default values which ends the sleep mode, activates the battery management system, and starts an emergency mode. The method also includes alternatively triggering the wake-up signal when a predefined wake-up time is passed and determining and predefining a new wake-up time and new default values before the battery management system switches into the sleep mode again.

9 Claims, 3 Drawing Sheets

(58) Field of Classification Search
CPC .. G01R 31/382; G01R 31/385; G01R 31/392; G01R 31/396; G01R 31/3835; H04Q 9/00; H04Q 2209/00; H04Q 2209/80; H04Q 2209/823; H04Q 2209/84; H04Q 2209/883
See application file for complete search history.

(56) References Cited

U.S. PATENT DOCUMENTS

| | | | |
|---|---|---|---|
| 12,145,453 B2 * | 11/2024 | He | .......................... G08B 25/10 |
| 2019/0006724 A1 | 1/2019 | Cho et al. | |

OTHER PUBLICATIONS

German Search Report issued in German application No. 10 2021 001 217.8 dated Jan. 11, 2022, with Statement of Relevancy (Thirteen (13) pages).

* cited by examiner

METHOD FOR MONITORING A BATTERY SYSTEM

BACKGROUND AND SUMMARY OF THE INVENTION

The invention relates to a method for monitoring a battery system of the kind defined in more detail herein.

Battery systems having at least one battery module that is based on a plurality of individual battery cells are known from the prior art. Such battery systems can be used when stationary. They are being used more and more frequently as traction batteries to drive an at least partially electric vehicle. To generate a high power density, the individual battery cells in the battery systems are frequently constructed using lithium ion technology.

On the one hand, this technology allows a high energy content of the individual battery cells, and on the other hand, it is the case that the risk of danger caused by the high energy content in the case of a defect is relatively high. One of the dangers, which can lead to a battery fire in the worst case, is so-called thermal runaway of the battery. In the case of an active battery, the battery, in particular the temperature, the voltage and further parameters, is thus typically monitored via a battery management system. A thermal runaway can then be recognized correspondingly early, and suitable reactions can be initiated to actively counteract serious damage or serious danger from the battery.

In practice, however, a significant proportion of such thermal incidents in batteries take place after the charging and during the inactive phase of the battery. The battery management system is then typically switched off or is in sleep mode, such that the thermal runaway is not recognized and, correspondingly, no countermeasures can be taken.

Newer developments, as are known, for example, from DE 10 2019 215 812 A1, address this problem by the use of a sensor arrangement or several sensor arrangements in addition to the battery management system. Such sensor arrangements can record measured values of the battery and compare them at least with default values at a substantially lower energy requirement than that of the battery management system. If critical values arise here, this is correspondingly recognized and the battery management system can be woken up via a wake-up signal to then initiate the further monitoring and, in some cases, the introduction of countermeasures. The specified unexamined published patent application further describes that the sensor arrangement has its own storage device to make a corresponding database available to the battery management system after the latter has been woken from sleep mode so that it can judge the situation as quickly as possible.

In practice, in such sensor arrangements and their associated electronics, which are typically designed as application-specific integrated circuits (ASIC), corresponding threshold values can be predefined to generate a wake-up signal. If these threshold values are set to the generally usual limits of, for example, 2 volts per cell and/or 80° C., then the battery management system wakes up exceptionally late in the event that an actual thermal runaway is present. As a certain amount of time is also required to completely "boot up" the battery management system, valuable time is lost, which, in the event of a thermal runaway, can often lead to countermeasures introduced by the battery management system being implemented too late to actually suppress the thermal runaway.

The object of the present invention is thus to create an improved method for monitoring a battery system with a wake-up of the battery system, which enables a very high level of safety at an acceptable energy efficiency.

The method according to the invention for monitoring a battery system having at least one battery module that has several individual battery cells comprises a battery management system and a sensor arrangement which is typically formed in the form of sensors and an application-specific integrated circuit. In the actual structure, several of these sensor arrangements are provided, which respectively monitor one or several of these individual battery cells. If the battery system is not being used, for example because a vehicle in which the battery system is used as a traction battery according to a preferred application is not being moved, then the battery management system goes into sleep mode, in which it typically does not require its own electrical energy, to save energy. Meanwhile, the at least one sensor arrangement further records at least one measured value for monitoring the battery system. These measured values can in particular comprise voltages and temperatures. The recorded measured values are compared with default values and, in the event of a deviation, a wake-up signal is generated for the battery management system and the latter is woken up or activated again. All this is so far known in principle from the prior art.

To ensure that the wake-up takes place in as timely a manner as possible, such that it is optionally possible to intervene such that a thermal runaway of the battery system can be prevented, it is provided according to the invention that, in addition to a wake-up signal due to an infringement of a default value by the at least one measured value, the wake-up signal is also triggered by the passing of a predefined wake-up time, wherein if the wake-up signal is triggered by the predefined wake-up time passing, a new wake-up time and new default values are determined and predefined by the battery management system before the battery management system switches into sleep mode again. If, on the other hand, the wake-up signal is triggered by an infringement of the default value by the recorded measured value, the battery management system is woken up and an emergency mode is started.

The method according to the invention thus allows the battery management system to wake up not only in an emergency, but also depending on a wake-up time to be determined. It is thus possible to track the default values as closely as possible, as threshold values for monitoring the battery management system, to guarantee as early a wake-up of the battery management system as possible in the event of an emergency arising. The battery management system can then verify the emergency in the emergency mode and introduce suitable measures so that it can react exceptionally quickly and efficiently to a potential emergency, such that a thermal runaway of the battery system can be intercepted in good time in almost all cases that arise.

According to a very favorable development of the method according to the invention, gradients of the temporal course of the at least one measured value and/or specified changes of the at least one measured value are incorporated into the determination of the new wake-up times and/or of the new default values. Predictions concerning the course of the measured values to be expected on the basis of the gradients can thus be used to track the limits for the wake-up of the battery management system in an emergency. In combination with specified change values, it can be identified when the gradient reaches this change value. The actual curve to be expected then runs above or below this gradient depending on the measured value, such that in a normal case, it is not expected that the new default value will be exceeded until the new wake-up time is reached. If this nevertheless occurs, it must be assumed that there is an emergency.

This variant thus offers the possibility of tracking the limits very closely. Thus, on the one hand, the occurrence of undesirable false alarms can be reduced and, on the other hand, an emergency can be recognized relatively quickly by a wake-up of the battery management system and by verifying the potential emergency when the limits are infringed. This creates enough time to be able to react very quickly to the cell modules being switched off, the cooling being booted up or similar measures, for example. The thermal runaway can thus be reliably prevented from spreading to the entire battery system in most cases.

According to a further very favorable embodiment of the method according to the invention, it can also be provided that a new wake-up time and new default values are individually determined and predefined for each sensor arrangement. Each of the sensor arrangements typically monitors one or several individual battery cells. These individual battery cells can react differently to events that have previously occurred, for example such as a journey of the vehicle in which the battery system serves as a traction battery according to a preferred application. This is typically to do with the manufacture-dependent tolerances of the individual battery cells. Thus, due to this particularly favorable embodiment of the method according to the invention and the individual adjustment of wake-up times and default values, it is possible to react to such irregularities within the battery. It is thus ensured that several individual battery cells potentially deviating due to manufacturing tolerances do not almost "accidentally" trigger an emergency alarm and wake up the battery management system, although their values with regard to these specific individual cells should still be seen as entirely uncritical.

According to a very favorable development of the method according to the invention, to determine the new wake-up times, a permitted change of the measured value is specified on the basis of the current values. Additionally, the highest and/or the lowest value recorded for an individual battery cell by the sensor arrangement is identified. On this basis, a measured value limit for the next wake-up is then calculated, and a gradient of the measured value at the current point in time is calculated. A wake-up time can then be calculated from these values of the limit in combination with the gradient as a new wake-up time at which the gradient reaches the calculated limit of the measured value. The limit as a default value and the wake-up time as a new wake-up time are then each used individually to give new "instructions" to the respective sensor arrangement according to the embodiment described above, so that the battery management system that has carried out these calculations can then be set to sleep mode again.

According to a further very favorable embodiment of this idea, further diagnoses and calculations can be carried out by the battery management system to ensure and/or to check the plausibility of the identified values, and thus of the new wake-up time and the new default values, in order to recognize and intercept potential miscalculations.

At least the temperatures and/or the cell voltages are monitored as the measured values to be monitored according to a very favorable development of the method according to the invention. A thermal runaway can already be identified via these values today. However, the method can be improved in the way described above by the close tracking according to the invention of the limits to recognize such a thermal runaway. In addition to these particularly important values of the temperature and the cell voltage, further values are also conceivable in theory, for example the pressure value described in the prior art specified in the introduction or the like.

The measured value limit can be calculated, depending on the measured value, by adding or subtracting the predefined change to or from the current measured value. According to a very favorable development of this idea, the sum or difference can additionally be offset with an offset value, which is for example based on measurements within the battery system, for example the current state of charge, or is predefined depending on the characteristics of the battery system. This offset value can also be calculated for the battery system via the battery management system, if the latter is active, and can adjust over time or to different situations, for example states of charge. A self-learning offset value so to speak thus arises, which is able, for example, to correspondingly map and take into account ageing effects in the battery system. This value can preferably be individually generated for each of the sensor arrangements such that it can also take different ageing effects in the individual cells of the battery system or its battery modules into account.

According to a very advantageous development of the method according to the invention, it is the case that the emergency mode comprises further measurements and/or diagnoses by the battery management system, wherein in the event of a confirmed emergency, countermeasures are introduced, and a warning is generated, and wherein in the event of an emergency that has not been confirmed, the battery management system is kept awake and the at least one measured value is monitored with narrowly predefined default values. The fact that this battery management system is kept awake after a potential but unconfirmed emergency increases safety such that the battery management system can still actively closely monitor the battery system via the measurement methods present in the battery management system, for example an impedance measurement or the like. It can thus be ruled out that the unconfirmed emergency has already indicated an emergency which is, however, still in such an early state that it also could not be verified by the battery management system. As the battery management system is kept awake and closely monitors the battery system in such a case, it is now possible to react quickly if the supposed but unconfirmed emergency does later develop into an actual emergency.

According to a very advantageous development of the idea, after a specified length of time has passed in which the narrowly predefined threshold values have not been infringed, the emergency mode can be ended, such that after a sufficient length of time, the monitoring of the battery management system returns to the sleep mode of the battery system with continuous monitoring exclusively via the sensor arrangements, which is thus exceptionally energy-efficient.

Further advantageous embodiments of the method according to the invention result from the exemplary embodiment, which is described in more detail in the following with reference to the figures.

DETAILED DESCRIPTION OF THE DRAWINGS

Figure 1:
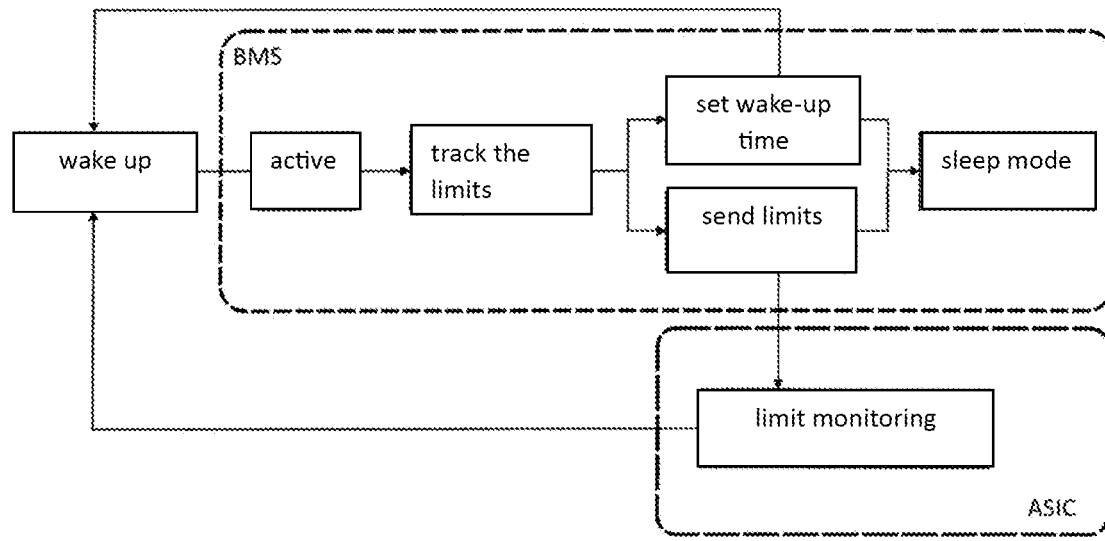
FIG. 1 shows a block diagram to clarify the sequence of the method according to the invention.

In the depiction of FIG. 1, the sequence of the method according to the invention is shown in principle in a block diagram. The actual limit monitoring, and thus the recording of the measured values from a battery system and the monitoring of whether these measured values infringe set default values, which are also referred to as limits in the following, is carried out by a sensor arrangement which is here referred to by its application-specific integrated circuit ASIC. If this is the case, the ASIC generates a wake-up signal by controlling the box designated "wake-up". The battery management system BMS is then correspondingly activated and the limit is tracked so long as no emergency is detected and verified by the battery management system BMS, which tracking, on the one hand, leads to a new limit or default value and, on the other hand, leads to a new wake-up time based on this default value. The new default values are transmitted to the limit monitoring of the respective ASICs, whereby the limits are tracked individually per sensor arrangement ASIC installed in the battery system. In parallel, the wake-up time is correspondingly set such that a time-dependent wake-up signal can be emitted to the battery management system BMS depending on time as an alternative and in addition to the wake-up signal based on the limit monitoring. The battery management system BMS is then set back into sleep mode and remains there until either an infringement of the closely-tracked limits has been recognized by the limit monitoring or the next wake-up time has been reached, which leads to a new wake-up and typically tracking of the limits in the battery management system BMS.

Figure 2:
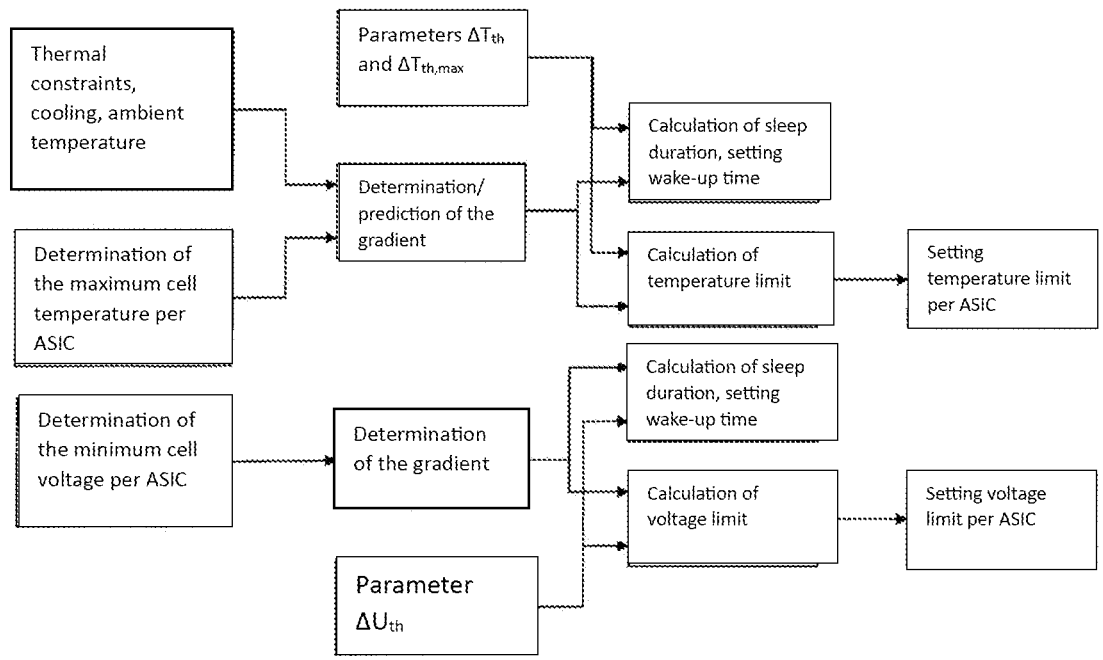
FIG. 2 shows a block diagram to explain the sequence of the limit tracking per sensor arrangement.

The tracking of the limits is specified in more detail in another block circuit diagram for a conceivable exemplary embodiment in FIG. 2. The thermal constraints, and thus for example the cooling, the ambient temperature and the like are taken into account, and the maximum cell temperature for each individual sensor arrangement or its ASIC is correspondingly determined. This temperature monitoring then leads to a determination and prediction of the temperature course to be expected with reference to a gradient. For this purpose, value changes $\Delta T_{th}$ and $\Delta T_{th,max}$ are correspondingly predefined. On the basis of this data and of the gradient, the sleep duration is calculated and a new wake-up time is set, and new temperature limits are calculated which, as has already been explained in the block circuit diagram depiction above, are then transmitted to the ASICs and correspondingly set there. The whole sequence preferably takes place individually for each ASIC.

In the lower half of the block circuit diagram of FIG. 2, a comparable sequence is described for the cell voltage. The basis here is the determination of the minimum cell voltage per sensor arrangement or the ASIC assigned to it. Here too, a gradient is determined on the basis of the measured value and a parameter for the maximum voltage change $\Delta U_{th}$ is correspondingly predefined. Also on the basis of this gradient and this default value, a sleep duration is then calculated and a wake-up time is set and a new voltage limit is calculated as a default value and transmitted to the respective ASIC and correspondingly used there for the future limit monitoring.

Figure 3:
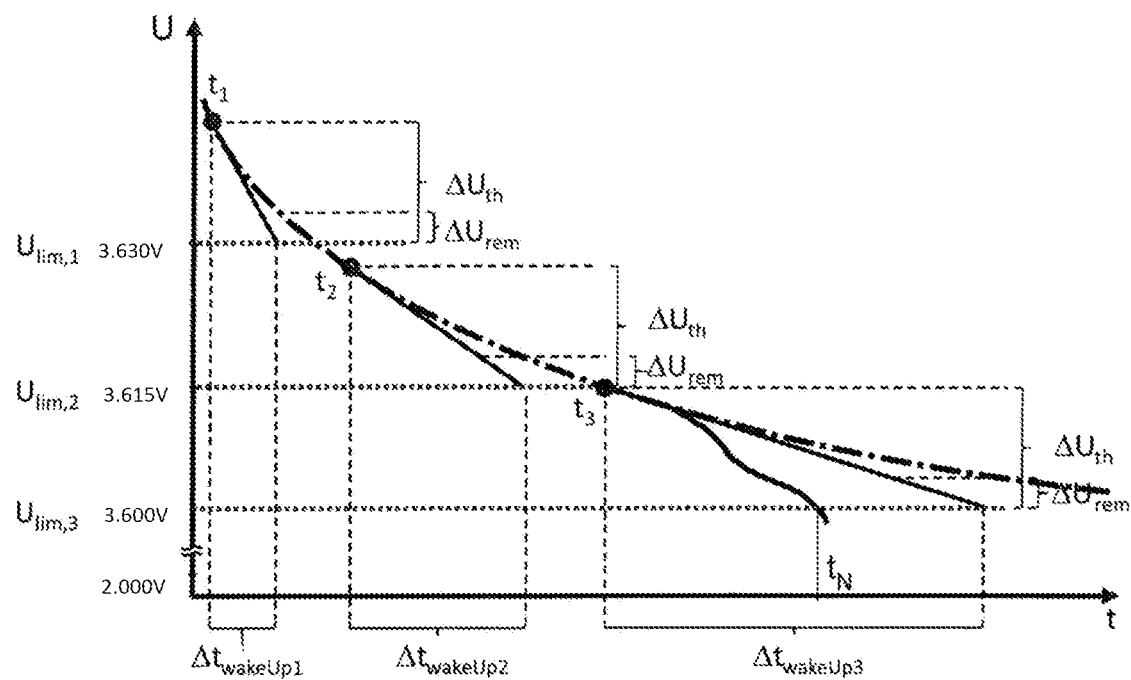
FIG. 3 shows a diagram of the cell voltage over time to clarify the method using the example of monitoring the cell voltage.
Figure 4:
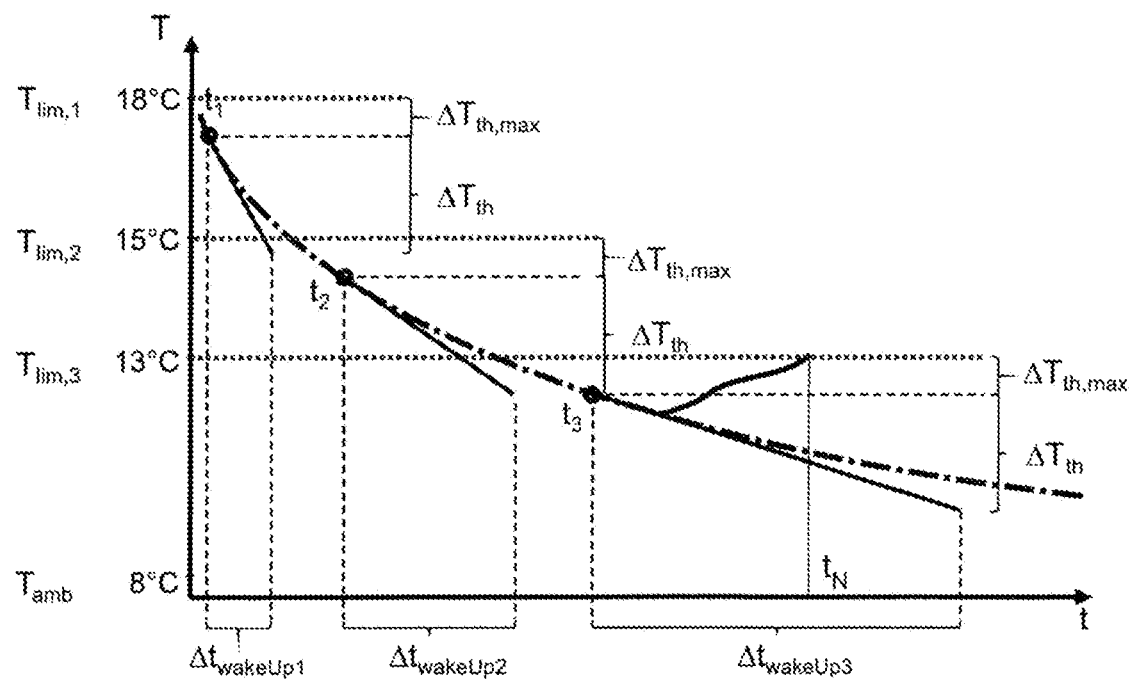
FIG. 4 shows a diagram of the cell temperature over time to clarify the method according to the invention using the example of the temperature of the battery system when cooling down.
Figure 5:
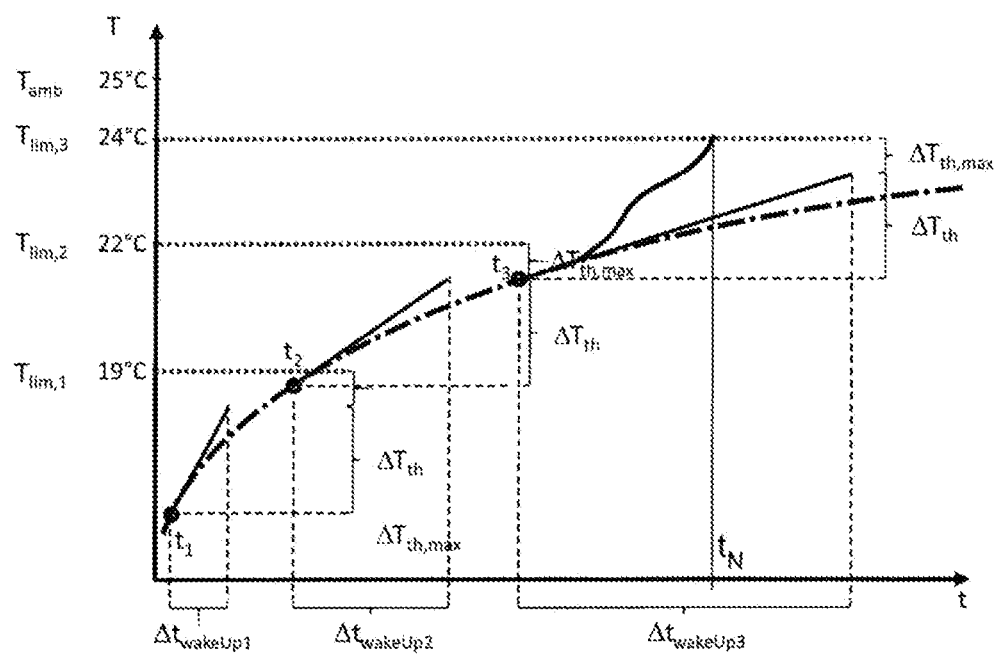
FIG. 5 shows a depiction analogous to that of FIG. 4 when warming up the battery system.

The diagrams of FIGS. 3 to 5 now show the voltage over time and temperatures over time in different exemplary cases to explain the sequence of the method in principle. The measured values are correspondingly respectively depicted with dashed lines, the gradients in the respective points with the thin solid lines and a potential deviation of the respective measured value respectively in the last temporal third of the course with the thick solid lines, the deviation leading to a wake-up of the battery management system as the limit is exceeded and thus triggering an emergency mode of the battery management system BMS, in particular to prevent a thermal runaway of the battery system.

In the depiction of FIG. 3, the voltage U is depicted as a measured value. The situation is as follows.

The starting position of the battery system is that the cell voltage U relaxes after a load. The course can be described in principle as a sum of e-functions, wherein a further very slight change is brought about by the self-discharge. If the situation is such that one of the battery cells sinks more significantly than the remaining cells, then a critical state can be present. A permanent monitoring and a comparison of all the battery cells is not possible, however, as the battery management system BMS would otherwise have to be constantly kept awake, which is undesirable for the reasons of energy efficiency described above. A wake-up-capable front end ASIC can thus be correspondingly used with the sensor arrangement. The approach to monitoring the battery system now defines a change value for the voltage U. This is designated $\Delta U_{th}$ in the depiction of the figure. In the following, the following steps are then carried out:

1. Determining the lowest cell voltage per sensor arrangement (ASIC) installed.
2. Setting a voltage limit $U_{lim,x}=U-\Delta U_{th}$ for the next wake-up of the battery management system BMS (wakeUp).
3. Identifying the voltage gradient at the point in time $t_x$.
4. Calculating the length of time $\Delta t_{wakeUp,x}$ until the next wake-up of the battery management system BMS from the gradient and the change value $\Delta U_{th}$. The next regular wake-up of the battery management system BMS then serves to track the voltage limit $U_{lim,x}$
5. The battery management system BMS is then set back to sleep mode.

If the battery management system BMS wakes up after the predefined wake-up time $\Delta t_{wakeUp}$ has passed, the steps 1 to 5 described are correspondingly repeated. Further diagnoses and calculations are additionally possible as required.

The voltage threshold value $\Delta U_{th}$ is a design parameter to be predefined that can for example be selected such that it is constant for all regions. It is advantageously selected differently, however, for the individual regions depending on the idle characteristic curve. In regions with a flat characteristic curve, for example a state of charge of approximately 50%, a lower value would then be selected, for example 5 mV, in comparison with higher or lower states of charge of for example less than 20% or more than 90%. As already specified above, it is used along with the identified voltage gradient to calculate the corresponding wake-up time $\Delta t_{wakeUp}$.

In the diagram of FIG. 3 it is shown that when the wake-up time $\Delta t_{wakeUp1}$ has passed, the difference $U_{rem}$ between the actual voltage and the set voltage threshold $\Delta U_{th}$ is sufficiently small that the wake-up would take place relatively quickly in the event of a deviation of the voltage. If the voltage correspondingly does not deviate unexpectedly, as is the case here at points $t_1$, $t_2$ and $t_3$, then the wake-up takes place as described above at the respective point in time at which the gradient reaches the corresponding voltage limit $U_{lim,1}$, $U_{lim,2}$ at the point $t_1$, $t_2$.

During the course of the third wake-up length of time $\Delta t_{wakeUp3}$, the voltage drops more significantly than expected, as depicted with a solid line. The wake-up of the battery management system BMS thus takes place due to a limit infringement at the point in time $t_N$ if the actual value reaches the voltage limit $U_{lim,3}$, in this case of 3.6 V. In comparison with the input of a standardized voltage limit, typically of 2 V, the wake-up of the battery management system BMS thus takes place much earlier, which gives the time required to react in an emergency mode. Such an emergency mode with its possibilities is described in more detail in connection with FIGS. 3 to 5.

In the depiction of FIG. 4, a comparable scenario is shown taking into account the cell temperature T, in this case when the battery system cools down. The starting point is that a temperature change takes place, for example due to a change in the ambient temperature. The cells of the battery system thus cool down. In principle, heating or cooling of the battery system would also be conceivable as a cause. Here it should be noted that the rates of change of the temperature are significantly limited due to the relatively large thermal mass of the battery system.

The approach to monitoring the battery system on the basis of the temperature T when the battery system cools down is again based on the definition of a change value of the temperature $\Delta T_{th}$ at which a regular wake-up should take place. The method then comprises the following steps:
1. Determining the highest cell temperature per sensor arrangement or ASIC.
2. Setting a temperature limit $T_{lim,x}=T+\Delta T_{th}$, as a temperature limit for the wake-up in the case of a limit infringement. Despite the cooling, the temperature limit $T_{lim,x}$ is higher than the current value, as in the event of a thermal runaway the temperature T of the individual cells increases correspondingly.
3. Identifying the temperature gradient at the point in time $t_x$.
4. Calculating the length of time until the next wake-up $\Delta t_{wakeUpx}$ on the basis of the temperature gradient and of the defined change value $\Delta T_{th}$. This regular wake-up of the battery management system BMS then serves to correspondingly track the temperature limit $T_{lim,x}$.
5. The battery management system BMS is set back to sleep mode.

The temperature value $T_{amb}$ in the depiction of the diagram of FIG. 4 symbolizes the ambient temperature.

The value $\Delta T_{th,max}$ serves to intercept a certain noise in the temperature signal. In principle and in theory, the limit could be set to the current temperature T, as the temperature T drops when cooling as the time t progresses. If, however, noise then occurs in the measured value of the temperature T, an undesired emergency alarm is very quickly triggered, such that this offset-value $\Delta T_{th,max}$ leads to a better result here. If, as is also conceivable, the value were to be (additionally) calculated with the defined change value $\Delta T_{th}$, an exceptionally long sleep duration could result during the cooling at a comparatively small temperature change, which leads to a wake-up due to a limit infringement taking place only at a very large temperature difference, which could then already be critical due to the low rates of change of the temperature.

During a wake-up after the wake-up length of time $\Delta t_{wakeUpx}$ has passed, the specified steps 1 to 5 are then correspondingly repeated, and here too, further diagnoses and calculations are possible.

In the region of the third wake-up time $\Delta t_{wakeUp3}$, the temperature T is infringed again at the point in time $t_N$, analogous to the explanation in FIG. 3, which is characterized by the temperature increase depicted with a solid bold line. As soon as this temperature T reaches the corresponding temperature limit $T_{lim,3}$, i.e., at the point in time $t_N$, a wake-up is initiated by a limit infringement, and the emergency mode of the battery management system BMS is thus initiated.

A further example using the temperature T as a parameter to be monitored is described in the depiction of FIG. 5. The requirements here are substantially the same as in the depiction in FIG. 4, except that this example involves a heating-up of the battery system, for example due to a changing ambient temperature or a preheating of a very cold battery system, such that its capacity is fully available or at least available in a sufficient quantity for the planned route from the beginning.

The approach here is once again the following. First, a change value is defined at which a regular wake-up should take place. The latter is once again designated $\Delta T_{th}$. The method then runs analogously to the method described above, such that the following steps are carried out:
1. Determining the highest cell temperature per sensor arrangement or ASIC.
2. Setting a temperature limit $T_{lim,x}=T+\Delta T_{th}+\Delta T_{th,max}$, as a temperature limit for the wake-up in the case of a limit infringement. Despite the cooling, the temperature limit $T_{lim,x}$ is higher than the current value, as in the event of a thermal runaway the temperature T of the individual cells increases correspondingly.
3. Identifying the temperature gradient at the point in time $t_x$.
4. Calculating the length of time until the next wake-up $\Delta t_{wakeUpx}$ on the basis of the temperature gradient and of the defined change value $\Delta T_{th}$. This regular wake-up of the battery management system BMS then serves to track the temperature limit $T_{lim,x}$.
5. The battery management system BMS is set back to sleep mode.

When setting the temperature limit $T_{lim,x}$, both the predefined change value $\Delta T_{th}$ and, as described above, the offset value $\Delta T_{th,max}$ must correspondingly be added to the current temperature T, as, in principle, the direction of the temperature change when heating up the battery system is the same as in the case of one of the individual cells overheating.

The rest behaves similarly. Here, too, there is a limit infringement at the point in time $t_N$, which wakes the battery management system BMS and initiates an emergency mode.

For the case depicted in the diagrams in FIGS. 3 to 5, in which the battery management system BMS has been woken by limit monitoring via a measured value of a sensor arrangement or its ASIC, an emergency must typically be assumed, e.g., an imminent thermal runaway of the battery system. Thus, if the battery management system BMS is woken by a wake-up signal triggered by a limit being exceeded via one of the sensor arrangements or its ASIC, then further variables are ascertained by the battery management system BMS, for example the insulation resistance of the battery system or individual modules and an impedance measurement of individual cells or individual modules of the battery system. Unlike pure monitoring via the sensor arrangement and the ASIC, this requires an active measurement mimicry, which is thus only available in a woken battery management system BMS. Then, however, it is also possible for the battery management system BMS to verify a critical condition of the battery on the basis of recorded parameters if the critical condition is present, and to emit a warning and introduce countermeasures. If no critical condition of the battery is initially verified, then the battery management system BMS can still be kept awake in the emergency mode, for example for a fixedly predefined length of time, and can undertake further active diagnoses during this time, e.g., the measurements of the insulation resistance or the impedance already mentioned. It can thus be ensured that a potential emergency, e.g., an imminent thermal runaway of the battery system is overlooked.

If everything remains quiet during the full duration of this predefined length of time, and thus if no measurements are taken that indicate a problem of the battery system, then the battery management system BMS can switch back into sleep mode after this length of time has passed. The further monitoring then takes place via the sensor arrangements and their ASICs again.

In addition, relative and derived parameters can be calculated from the cell voltages and temperatures recorded by the sensor arrangements, via which it is also possible to verify a potential critical state. These could be variances of cell voltages and temperatures, gradients of cell voltages and temperatures and a comparison of the gradients and the variances of temperatures and voltages. Due to the closely tracked limits, all this results overall in the battery management system BMS being woken exceptionally quickly in the case of an imminent emergency, such that sufficient time remains to counteract a thermal runaway of the battery via countermeasures such as activating or deactivating partial regions of the battery system, undertaking cooling, switching consumers on or off or the like.

The invention claimed is:

1. A method for monitoring a battery system having a battery module that has a plurality of battery cells, wherein a battery management system is not active in a sleep mode of the battery system, comprising steps of:
   monitoring a measured value in the sleep mode by at least one sensor arrangement and comparing the measured value with default values by the at least one sensor arrangement;
   triggering a wake-up signal when the measured value deviates from the default values and ending the sleep mode, activating the battery management system, and starting an emergency mode by the triggered wake-up signal; and
   alternatively triggering the wake-up signal when a predefined wake-up time is passed and determining and predefining a new wake-up time and new default values before the battery management system (BMS) switches into the sleep mode again;
   wherein gradients of a temporal course of the measured value and/or a specified change of the measured value are incorporated into the determining of the new wake-up time and/or of the new default values.

2. The method according to claim 1, wherein the new wake-up time and the new default values are individually determined and predefined for each sensor arrangement.

3. The method according to claim 1, wherein the monitored measured value comprises a temperature or a voltage of the battery system or of individual battery cells.

4. The method according to claim 1, wherein the emergency mode comprises measurements and/or diagnoses by the battery management system, wherein in an event of a confirmed emergency countermeasures are introduced and a warning is emitted, and wherein in an event of an emergency that has not been confirmed the battery management system is kept awake and the measured value is monitored with narrowly predefined threshold values.

5. The method according to claim 4, wherein after a specified length of time has passed in which the threshold values have not been infringed, the emergency mode is ended.

6. A method for monitoring a battery system having a battery module that has a plurality of battery cells, wherein a battery management system is not active in a sleep mode of the battery system, comprising steps of:
   monitoring a measured value in the sleep mode by at least one sensor arrangement and comparing the measured value with default values by the at least one sensor arrangement;
   triggering a wake-up signal when the measured value deviates from the default values and ending the sleep mode, activating the battery management system, and starting an emergency mode by the triggered wake-up signal; and
   alternatively triggering the wake-up signal when a predefined wake-up time is passed and determining and predefining a new wake-up time and new default values before the battery management system switches into the sleep mode again;
   wherein to determine the new wake-up time and the new default values, a permitted change of the measured value is specified on a basis of a current measured value, and a highest and/or a lowest value recorded for one of the battery cells by the at least one sensor arrangement is identified, from which a measured value limit is calculated for a next wake-up and a gradient of the measured value is calculated at a current point in time, wherein the new wake-up time is calculated from the measured value limit and the gradient.

7. The method according to claim 6, further comprising steps of diagnosing and/or calculating to ensure and/or check a plausibility of the identified highest and/or lowest value recorded.

8. The method according to claim 6, wherein the measured value limit is calculated by adding or subtracting the permitted change to or from the current measured value.

9. The method according to claim 8, wherein a sum or difference is offset with an offset value.

* * * * *